US012785027B2

(12) United States Patent
Pradip

(10) Patent No.: US 12,785,027 B2
(45) Date of Patent: Nov. 3, 2026

(54) METHOD OF OPERATING AN ION BEAM SOURCE, ION BEAM SOURCE AND COMPUTER PROGRAM

(71) Applicant: Carl Zeiss Microscopy GmbH, Jena (DE)

(72) Inventor: Ramu Pradip, Heidenheim (DE)

(73) Assignee: Carl Zeiss Microscopy GmbH, Jena (DE)

( * ) Notice: Subject to any disclaimer, the term of this patent is extended or adjusted under 35 U.S.C. 154(b) by 327 days.

(21) Appl. No.: 18/431,498

(22) Filed: Feb. 2, 2024

(65) Prior Publication Data

US 2024/0266139 A1 Aug. 8, 2024

(30) Foreign Application Priority Data

Feb. 3, 2023 (DE) ..................... 10 2023 102 672.0

(51) Int. Cl.

| | |
|---|---|
| ***H01J 37/08*** | (2006.01) |
| ***H01J 37/24*** | (2006.01) |
| ***H01J 37/244*** | (2006.01) |

(52) U.S. Cl.

CPC ............ *H01J 37/08* (2013.01); *H01J 37/244* (2013.01); *H01J 2237/24585* (2013.01); *H01J 2237/24592* (2013.01)

(58) Field of Classification Search

CPC ..................... H01J 37/08; H01J 37/244; H01J 2237/24585; H01J 2237/24592

See application file for complete search history.

(56) References Cited

U.S. PATENT DOCUMENTS 9,349,571 B2 5/2016 Kemen et al.
11,380,519 B1 * 7/2022 Preikszas ............. H01J 37/145
(Continued)

FOREIGN PATENT DOCUMENTS

CN 105593967 A 5/2016
DE 10 2013 014 976 A1 3/2015
(Continued)

OTHER PUBLICATIONS

German Office Action, with translation thereof, for corresponding DE Appl No. 10 2023 102 672.0, dated Nov. 10, 2023.
(Continued)

*Primary Examiner* — Nicole M Ippolito
(74) *Attorney, Agent, or Firm* — Fish & Richardson P.C.

(57) ABSTRACT

Operating an ion beam source comprises operating the ion beam source in a beam generation mode and operating the ion beam source in a decontamination mode. Operating in beam generation mode includes generating an ion beam from ions emitted from a tip. Operating in decontamination mode includes supplying power to a heating wire to raise the temperature of the heating wire to a decontamination temperature, measuring a change over time of a physical property indicating a temperature of the heating wire while the power is supplied to the heating wire, and displaying an indication based on the measured change over time of the physical property and/or storing a change value based on the measure change over time of the physical property. The ion beam source comprises the heating wire, a metal reservoir mechanically connected to the heating wire, and the tip mechanically connected to the metal reservoir.

21 Claims, 4 Drawing Sheets

(56) References Cited

U.S. PATENT DOCUMENTS

| | | | |
|---|---|---|---|
| 2007/0034399 A1 | 2/2007 | Pilz et al. |
| 2012/0061565 A1 | 3/2012 | Enyama et al. |
| 2012/0126684 A1 | 5/2012 | Kaga et al. |
| 2013/0248731 A1 | 9/2013 | Tanimoto et al. |
| 2015/0348749 A1 | 12/2015 | Lang et al. |
| 2018/0053627 A1 | 2/2018 | Phaneuf et al. |
| 2020/0027694 A1 | 1/2020 | Wang et al. |

FOREIGN PATENT DOCUMENTS

| | | | |
|---|---|---|---|
| DE | 10 2013 016 113 | A1 | 3/2015 |
| JP | H10-208652 | A | 8/1998 |
| JP | 2014 235883 | A | 12/2014 |
| TW | 201841190 | A | 11/2018 |
| WO | WO 2005/024881 | A2 | 3/2005 |
| WO | WO 2007/028595 | A2 | 3/2007 |
| WO | WO 2007/060017 | A2 | 5/2007 |
| WO | WO 2015/181808 | A1 | 12/2015 |
| WO | WO 2018/145983 | A1 | 8/2018 |

OTHER PUBLICATIONS

A.L. Eberle et al., *Mission (im)possible—mapping the brain becomes a reality*, Microscopy 64 (2014), S. 45-55.
International Search Report and Written Opinion for corresponding PCT Appl No. PCT/EP2020/000012, dated Jul. 121, 2020.
Office Action in German Appln. No. 10 2023 102 672.0, mailed on May 7, 2026, 8 pages (with English translation).

* cited by examiner

METHOD OF OPERATING AN ION BEAM SOURCE, ION BEAM SOURCE AND COMPUTER PROGRAM

CROSS-REFERENCE TO RELATED APPLICATION

This application claims benefit under 35 U.S.C. § 119 to German Application No. 10 2023 102 672.0, filed Feb. 3, 2023. The entire disclosure of this application is incorporated by reference herein.

FIELD

The present disclosure is directed to a method of operating an ion beam source, the ion beam source and a computer program.

BACKGROUND

Ion beam sources for generating an ion beam in an ion beam system are commonly realized by a metal reservoir, often containing metals, such as Gallium, and a heat source for melting and/or removing unwanted accumulations of material. The Gallium contained in the metal reservoir has a low melting point, which results in the metal melting and thus emitting ions. When emitting ions, an amount of metal contained in the metal reservoir is reduced. The time from manufacturing to a full depletion of the metal reservoir is known as the lifetime of the ion beam source. Because of the above, the ion beam source is typically replaced from time to time. Conventionally, ion beam sources used in ion beam systems are often replaced after a predetermined time of usage of the ion beam source. In particular, the predetermined time of usage can be a property of the ion beam source indicated by the manufacturer. The lifetime and the time of usage may be indicated in units of time or, for example, units of a cumulative operating current of the ion beam source. When replacing the ion beam source, a new ion beam source is usually installed in the ion beam system.

The ion beam source may be subject to defects, which often have an influence on an actual lifetime of the ion beam source. Thus, when indicating a predetermined time of usage, this predetermined time of usage is usually specified conservatively to account for unexpectedly rapid depletion of the metal reservoir. Therefore, a non-defective ion beam source can be highly likely to have its reservoir non-empty at the specified or guaranteed lifetime and blind replacement of the ion beam source anticipating full depletion can result in a waste of material. Moreover, this can negatively impact performance of the ion beam system as this mode of replacement generally reduces service intervals.

On the other hand, defects in the ion beam source and/or wrong selection of parameters for decontamination of the source might also dramatically reduce the remaining lifetime of the ion beam source.

SUMMARY

The present disclosure seeks to provide a method of operating an ion beam source with less waste of material.

In an aspect, the disclosure provides a method of operating an ion beam which comprises operating the ion beam source in a beam generation mode and operating the ion beam source in a decontamination mode, wherein the operating of the ion beam source in the beam generation mode includes generating an ion beam from ions emitted from a tip of the ion beam source, the tip being mechanically connected to a metal reservoir of the ion beam source and provided for emitting ions supplied from the metal reservoir. The metal reservoir of the ion beam system is mechanically connected to a heating wire of the ion beam source. The operating of the ion beam source in the decontamination mode includes supplying power to the heating wire to raise the temperature of the heating wire to a decontamination temperature, measuring a change over time of a physical property indicating a temperature of the heating wire while the power is supplied to the heating wire, and displaying an indication based on the measured change over time of the physical property, and/or storing a change value based on the measured change over time of the physical property.

The decontamination mode is performed to remove unwanted material accumulating on the surface of the tip and the metal reservoir. During the decontamination mode, the temperature of the heating wire is raised to a suitable decontamination temperature, such that accumulated material reducing the emission of the ion beam source is evaporated and thus removed. It is to be noted that the decontamination mode can be performed independently from the beam generation mode, but can also be performed, for example, directly before the beam generation mode.

In addition, storing the change value based on the measured change over time of the physical property may include, for example, storing in a storage of the ion beam system, a storage of a display for displaying the indication based on the measured change over time of the physical property, and/or a cloud server.

According to some embodiments, the indication represents an expected lifetime of the ion beam source, a warning that the lifetime of the ion beam source expires soon, and/or a message indicating that service is desired. In particular, the lifetime may be represented by an actual time, or, for example, by a cumulative operation current of the ion beam source.

According to some embodiments, the change value represents an expected lifetime of the ion beam source, an amount of metal contained in the metal reservoir, and/or an erroneous supplying of power when operating the ion beam source in the decontamination mode. In particular, the supplying of power might be erroneous when the temperature of the heating wire is not raised to the suitable decontamination temperature. For example, the heating wire may be overheated by supplying too much power such that the temperature of the heating wire is raised way above the suitable decontamination temperature.

According to some embodiments, the method further comprises deciding whether to continue using the ion beam source or to stop using the ion beam source based on the displayed indication and/or the stored change value. In particular, the decision may be realized by comparing the stored change value with a predetermined value. For example, the change value of an ion beam source may be measured, of which it is known that its lifetime is almost or fully expired. In this case, the currently measured change value can be compared with the predetermined change value of the depleted ion beam source. It is to be noted that, in this case, the term "continue using" is to be understood in the sense that the ion beam source is not replaced. Alternatively, a maintenance of the ion beam system and, in particular, an exchange of the ion beam source may be scheduled based on the displayed indication and/or the stored change value.

According to some embodiments, the method further comprises disposing the ion beam source if it is decided to stop using the ion beam source. This may also include recycling remaining metal of the metal reservoir.

According to some embodiments, supplying the power comprises supplying an electric current to the heating wire.

According to some embodiments, supplying the power comprises controlling the current supplied to the heating wire such that it is constant.

According to some embodiments, the physical property is a voltage across the heating wire.

As already mentioned above, supplying the power is not necessarily performed by supplying a constant current to the heating wire. For example, the supplying of the power may also comprise applying a constant voltage to the heating wire. In such a case, the physical property may be, for example, the current flowing through the heating wire.

According to some embodiments, the ion beam source is operated in the decontamination mode a plurality of times. For example, the ion beam source may be operated in the decontamination mode at least ten times until it is decided to stop using the ion beam source. This means that sufficient data can be acquired to come to a reliable decision. In particular, defects occurring in the ion beam source may be detected sooner when performing the decontamination mode more often, enabling an adapted estimation of the remaining lifetime of the ion beam source or an adapted operation of the ion beam source.

According to some embodiments, operating the ion beam source in the beam generation mode includes recording a usage value of the ion beam source representing an amount of time the ion beam source has been operated in the beam generation mode and/or amount of ions have been emitted from the tip of the ion beam source. In particular, the amount of time the ion beam source has been operated and/or amount of ions have been emitted from the tip of the ion beam source may also be recorded during the decontamination mode. From these recordings it is possible to associate a respective usage time to the ion beam source during each measurement of the change value, the usage time being a cumulated time the ion beam source has been emitting and thus reducing the mass of the metal reservoir. The usage time may be, in particular, indicated in units of time, or, for example, in units of a cumulated current during operation of the ion beam source.

According to some embodiments, the method comprises storing history data comprising plural change values, each change value being associated with the usage value of the ion beam source at the time when the change value is determined. This can allow for more complex analyzation of the dependency between the usage time of the ion beam source and the change value, wherein the change value represents an amount of metal contained in the metal reservoir of the ion beam source, as previously mentioned above.

According to some embodiments, the method further comprises determining an expected remaining lifetime of the ion beam source based on the history data. For example, this may be realized by extrapolating the history data up to a reference value of an ion beam source with almost or fully expired lifetime. However, the present disclosure is not limited to extrapolating the history data in this case. For example, the history data may also be used to verify if the ion beam source is physically behaving as planned by the manufacturer and if so, the total lifetime of the ion beam source roughly corresponds to the time of usage given by the manufacturer, wherein the remaining lifetime can be determined from the total lifetime and the usage time.

According to some embodiments, the method further comprises determining a change in a configuration of the ion beam source based on the history data. For example, it may be determined from sudden and abrupt changes in the history data that the ion beam source is subject to a defect, such as a broken connection between the heating wire and the metal reservoir. In case of such a broken connection between the heating wire and the metal reservoir, the metal reservoir has less influence on the temperature of the heating wire, thus allowing a detection of the defect by measuring properties depending on the temperature of the heating wire.

According to some embodiments, measuring the change over time of the physical property comprises measuring a first value of the physical property at a first time equal to or later than ten seconds after a start of the supplying of power to the heating wire, measuring a second value of the physical property at a second time later than ten seconds after the start of the supplying of power to the heating wire and equal to or before 25 seconds after the start of the supplying of power to the heating wire, wherein the second time is different from the first time, and determining a first change over time between the first value and the second value based on the first time and the second time. This includes, for example measuring the first value at 10 seconds after the start of supplying power, and measuring the second value at 25 seconds after the start of supplying power, resulting in a 15 seconds interval. Shorter intervals may be possible.

According to some embodiments, the second time may be 3 seconds after the first time, resulting in a 3 second interval.

According to some embodiments, measuring the change over time of the physical property further comprises measuring a third value of the physical property at a third time later than the second time and before 25 seconds after the start of the supplying of power to the heating wire, wherein the third time is different from the first and second times, determining a second change over time between the second value and the third value based on the second time and the third time, and selecting the highest change over time from the first and second changes over time. It should be noted that, although the above suggests two intervals, the change over time may be determined for more intervals. For example, in case of the 3 second intervals described above, the change over time may be determined for 5 intervals, and the highest of the determined changes over time may be selected.

In some embodiments, an ion beam system comprises an ion beam source, which includes a heating wire, a metal reservoir mechanically connected to the heating wire, and a tip mechanically connected to the metal reservoir and provided for emitting ions supplied from the reservoir. The ion beam system also comprises a power supply configured to supply power to the heating wire of the ion beam source, and a controller configured to control the power supply, wherein the ion beam system is configured to perform the method according to the embodiments described above. The power supply may be installed inside the physical configuration of the ion beam system, such that the ion beam source is connected to the power supply by electrically connecting the ion beam source to a terminal provided near the installment location of the ion beam source. However, the present disclosure is not limited in this regard. For example, the power supply may also be included in the ion beam source. In this case, the ion beam source may be connected to the ion beam system via a communication line and a corresponding terminal in the ion beam system.

In some embodiments, a computer program comprises instructions that, when read by the controller of the above described ion beam system, cause the ion beam system to perform the method according to the embodiments described above. In particular, the computer program may be stored in an internal storage medium of the ion beam system, such as a hard drive, or may be stored in an external storage medium, such as a USB flash drive.

In the following, specific embodiments are described in detail with reference to the figures.

DETAILED DESCRIPTION

Figure 1:
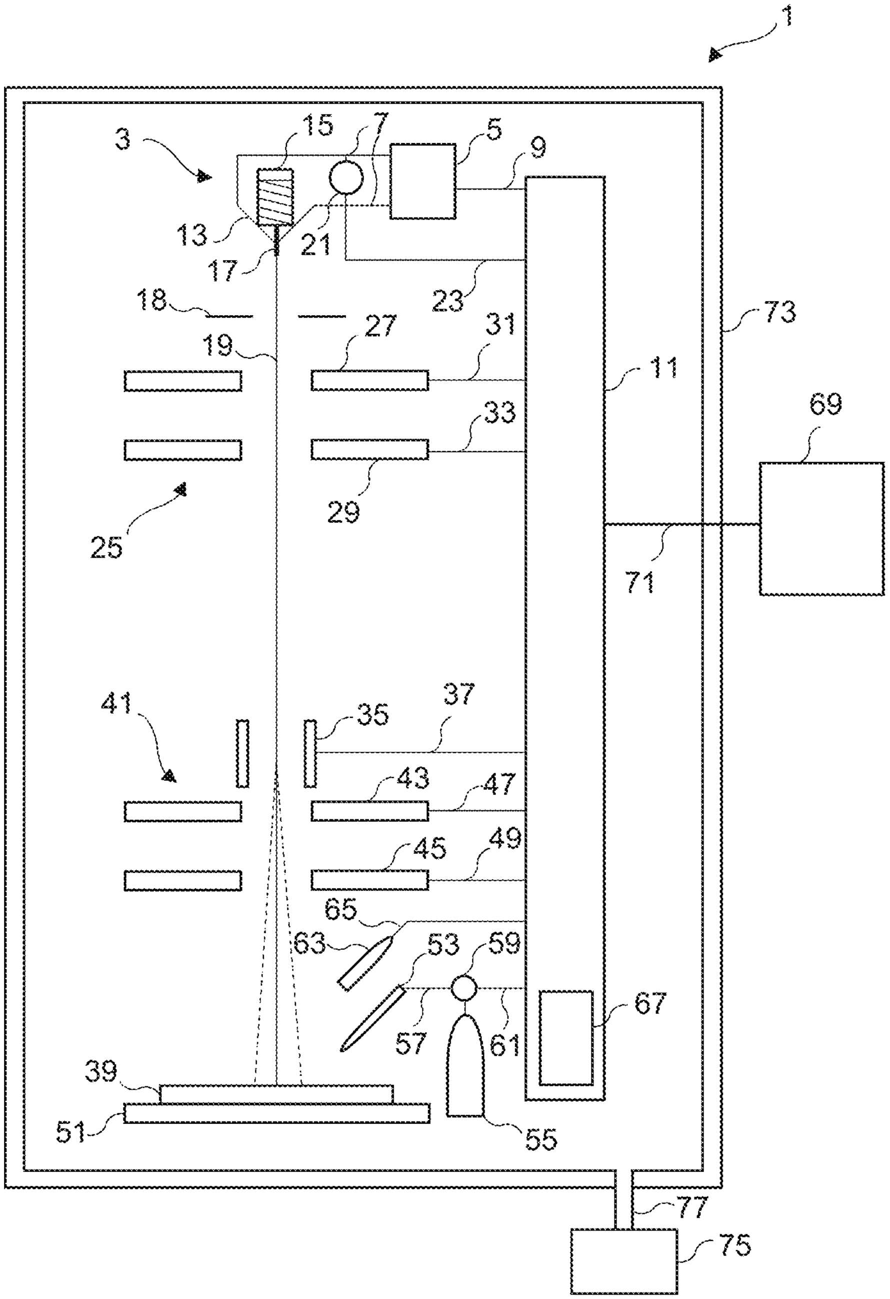
FIG. 1 is a schematic diagram showing an ion beam system according to an embodiment of the present disclosure.

First, an ion beam system according to an embodiment will be described in detail with reference to FIG. 1. FIG. 1 is a schematic diagram showing an ion beam system 1 according to an embodiment of the present disclosure. The ion beam system 1 comprises an ion beam source 3 connected to a power supply 5 via connection lines 7. The power supply 5 is connected to a controller 11 via a communication line 9. Due to the communication line 9, the controller 11 is able to instruct the power supply 5 to supply a power, and in particular to adjust the supplied power such that electric properties have an instructed value.

The ion beam source 3 comprises a heating wire 13, a metal reservoir 15 mechanically connected to the heating wire 13, and a tip 17, which will be described in more detail later. The heating wire 13 is connected to the power supply 5 via the connection lines 7, such that the power supply 5 is able to supply power to the heating wire 13. By supplying power to the heating wire 13, a current will flow through the heating wire 13, resulting in the temperature of the heating wire 13 increasing due to an electric resistance of the heating wire 13. The metal reservoir 15 is mechanically connected to the heating wire 13. In the case of FIG. 1, part of the heating wire 13 is wound around the metal reservoir 15, such that the heat generated in the heating wire 13 is conducted to the metal reservoir 15. Thus, the metal reservoir 15 can be heated by the heating wire 13 and unwanted accumulations of other material can be removed.

The metal contained in the metal reservoir 15 melts due to its low melting point. Depending on the metal used in the ion beam source 3, it may be involved to additionally heat the metal above its melting point, such that the metal is in a molten state. Metal ions are extracted from the melted metal and accelerated by an accelerating electrode 18 included in the ion beam system 1 to form an ion beam 19. The ion beam system 1 further comprises a measurement tool 21 to measure an electric property of the ion beam source 3. In the embodiment shown in FIG. 1, the measurement tool 21 is connected such that it is able to perform a measurement of an electric property of the current flowing through the heating wire 13. The measurement tool 21 is connected to the controller 11 via a communication line 23, such that the controller 15 can receive measurements of the measurement tool 21. The configuration and functions of the ion beam source 3, as well as closely related components of the ion beam system 1 will later be described in more detail.

The ion beam 19 generated by the ion beam source 3 then traverses a condenser lens 25. In the case of FIG. 1, the condenser lens 25 is shown to be an electrostatic lens, in particular an einzel lens. The condenser lens 25 includes an upper electrode 27 and a lower electrode 29. The upper electrode 27 and the lower electrode 29 are annular ring electrodes surrounding the path of the ion beam 19. The upper electrode 27 is connected to the controller 11 by a connection line 31 and the lower electrode 29 is connected to the controller 11 by a connection line 33, such that the controller 11 is able to apply a voltage between the upper electrode 27 and the lower electrode 29. By applying a voltage between the two electrodes 27 and 29, an electrostatic field is generated between the two electrodes 27 and 29, wherein the electrostatic field protrudes inhomogeneously into the path of the ion beam 19, thus acting as a focusing field onto the ion beam 19. The controller 11 adjusts the voltage applied between the upper electrode 27 and the lower electrode 29 such that the condenser lens 25 collimates the ion beam 19.

The ion beam 19 then traverses a deflection mechanism 35. The deflection mechanism 35 is connected to the controller 11 via a connection line 37, such that the controller 11 is able to apply one or more electric fields between electrodes of the deflection mechanism 35. The deflection mechanism 35 is configured such that the ion beam 19 can be directed onto several different locations on a workpiece 39 to be processed. This can be realized by applying electrostatic fields perpendicular to the path of the ion beam 19.

After passing the deflection mechanism 35, the ion beam 19 traverses an objective lens 41. The objective lens 41 is, similar to the condenser lens 25, built as an electrostatic lens, in particular an einzel lens. Although being described as electrostatic lenses herein, the objective lens 41 and the condenser lens 25 may be different types of lenses that have a focusing effect on a beam of charged particles. In case of FIG. 1, the objective lens 41 comprises an upper electrode 43 and a lower electrode 45. The electrodes 43 and 45 are annular ring electrodes surrounding the path of the ion beam 19. The upper electrode 43 is connected to the controller 11 by a connection line 47 and the lower electrode 45 is connected to the controller 11 by a connection line 49, such that the controller 11 is able to apply a voltage between the upper electrode 43 and the lower electrode 45. By applying a voltage between the electrodes 43 and 45, the ion beam 19 is focused by an inhomogeneous part of the electrostatic field generated in the objective lens 41. In particular, the controller 11 adjusts the applied voltage such that the ion beam 19 is focused onto the workpiece 39. In other words, the applied voltage is adjusted such that a beam spot on the workpiece 39 is minimal.

The workpiece 39 is held inside the ion beam system 1 by a stage 51. The stage 51 may be removable to be able to manually insert the workpiece 39 into the ion beam system 1.

The ion beam system 1 further comprises a gas nozzle 53 injecting a gas from a gas tank 55. The gas may be an inert gas, for example in the case of a charge compensation such that charge induced by the ions does not accumulate in the workpiece 39, or may be an assist gas, for example to start a chemical reaction additionally removing material of the workpiece 39 near the location where the ion beam 19 is incident on the workpiece 39. The gas nozzle 53 is connected to the gas tank 55 by a gas pipe 57 including a valve 59. The valve 59 is connected to the controller 11 via a connection line 61, such that the controller 11 is able to adjust the pressure of the gas passing through the gas pipe 57. The valve 59 can be a magnetic valve that can be controlled electronically, but may also be a mechanical valve.

Furthermore, the ion beam system 1 comprises an electron detector 63. The electron detector 63 is able to detect secondary electrons emitted from the workpiece 39 when the ion beam 19 is incident. In this way, processing of the workpiece 39 can be monitored and corrected if desired. The electron detector 63 generates readings based on the number of secondary electrons incident on the electron detector 63 and transmits these readings to the controller 11 via a communication line 65.

The controller 11 comprises a storage 67 storing data received by the controller 11. For example, the data received from the measurement tool 21 and the data received from the electron detector 63 may be stored in the storage 67. In addition, the ion beam system 1 also comprises a display 69 connected to the controller 11 via a communication line 71. The display 69 is able to display the readings, messages and the like to a user of the ion beam system 1. In particular, the controller 11 can instruct the display 69 to display warnings based on a state of the components included in the ion beam system 1.

In addition, the ion beam system 1 comprises a vacuum chamber 73 encompassing most of the components of the ion beam system 1. It should be noted that the vacuum chamber 73 does not necessarily encompass all the components encompassed in FIG. 1. For example, the controller 11 may be installed externally to the vacuum chamber. In particular, the controller 11 and the display 69 may be implemented as a personal computer and a standard screen, respectively, outside of the vacuum chamber 73. A vacuum pump 75 connected to the vacuum chamber 73 by a pipe connection 77 generates a vacuum inside the vacuum chamber 73.

Figure 2:
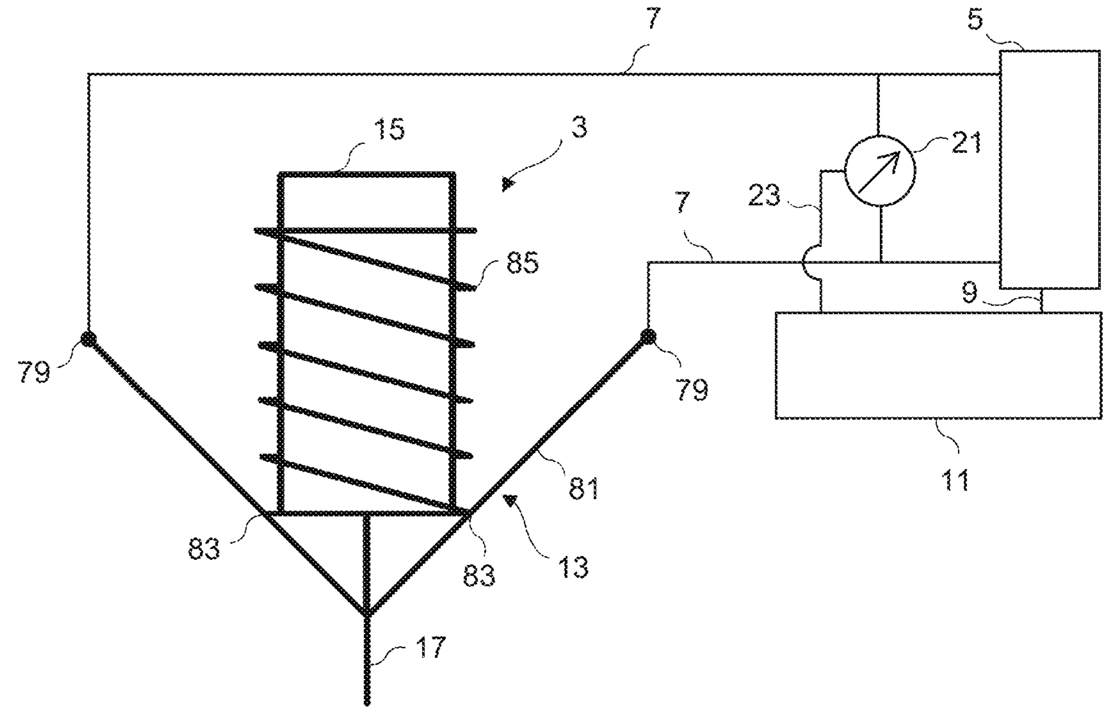
FIG. 2 is a schematic diagram showing an ion beam source included in the ion beam system of FIG. 1 in more detail.

Next, a configuration of the ion beam source 3 and closely related components of the ion beam system 1 will be described in more detail with reference to FIG. 2. FIG. 2 is a schematic diagram showing an ion beam source 3 included in the ion beam system 1 of FIG. 1 in more detail.

The ion beam source 3 comprises the heating wire 13, the metal reservoir 15 and the tip 17. The heating wire 13 has two ends 79 and a section 81 with direct connection between the two ends 79. The section 81 comprises two contact points 83, where a heating coil 85 is mechanically fixed to the section 81 of the heating wire 13. The heating coil 85 is wound around the metal reservoir 15, the metal reservoir being a cylindrically formed material containing a metal of which ions are to be extracted. The ion beam source 3 further comprises a tip 17, extending from the metal reservoir 15 downward.

The two ends of the heating wire 13 are connected to the power supply 5 via the connection lines 7. The power supply 5 is controlled by the controller 11 via the communication line 9. In addition, in FIG. 2, the measurement tool 21 is a voltmeter for measuring the voltage dropping over the heating wire 13, in particular over the section 81 of direct connection between the two ends 79. Thus, the measurement tool 21 is connected between the two connection lines 7 and is able to transmit the measured voltage drop to the controller 11 via the communication line 23.

When the controller 11 instructs the power supply 5 to heat the heating wire 13, the power supply supplies an electric current via the connection lines 7, wherein the current then flows through the section 81 of the heating wire 13. Since the section 81 has an electric resistance, the temperature of the heating wire 13 starts to increase. However, since the section 81 is mechanically and thus thermally connected to the heating coil 85 via the contact points 83, the heat generated in the section 81 will be conducted to the heating coil 85 and thus also to the metal reservoir 15. As a result, the temperature increase of the section 81 strongly depends on the heat capacity of the heating wire 13 and the metal reservoir 15. Because the heat capacity of the metal reservoir 15 is directly proportional to the amount of material contained in the metal reservoir 15, the temperature increase of the heating wire 13 depends on this amount of material.

With increasing temperature of the section 81, the electric resistance of the section 81 increases. Thus, when holding the electric current flowing through the section 81 constant, the voltage dropping over the section 81 of the heating wire reflects the amount of material contained in the metal reservoir 15. Thus, a value representing the amount of material inside the metal reservoir 15 can be obtained by the measurement tool 21, which is then transmitted to the controller 11.

Although it is described herein that the power supply 5 holds the electric current through the section 81 of the heating wire 13 constant and the voltage dropping over the heating wire 13 is measured by the measurement tool 21, different configurations may be used. For example, the voltage between the two ends 79 of the heating wire 13 is held constant and the measurement tool 21 measures a decreasing current flowing through the section 81 of the heating wire 13.

Figure 3:
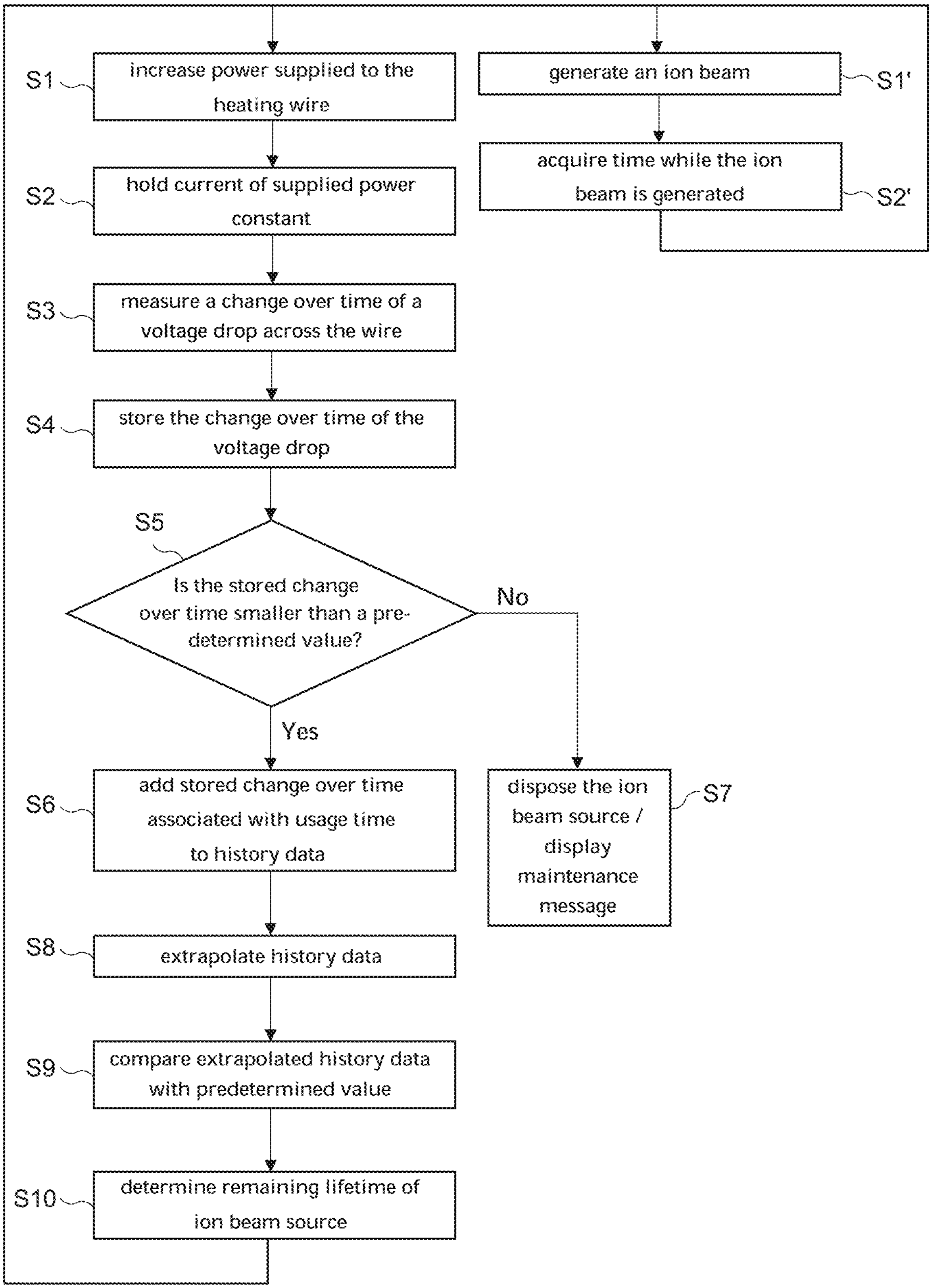
FIG. 3 is a flow diagram visualizing a method of operating the ion beam system of FIG. 1 according to an embodiment.

In the following, the method of operating the ion beam system 1 will be described with reference to FIG. 3. FIG. 3 is a flow diagram visualizing the method of operating the ion beam system 1 of FIG. 1 according to an embodiment. The method comprises a beam generation mode, which is shown in the right column by steps S1' and S2', and a decontamination mode, which is shown in the left column by steps S1 to S10. The ion beam system 1 is able to switch from the beam generation mode to the decontamination mode, and vice versa. The beam generation mode comprises operating the ion beam source 3 to generate the ion beam 19 and processing the workpiece 39 in the step S1'. Since the generation of the ion beam 19 is already described in detail above, a redundant description will be omitted, and the decontamination mode will be mainly described.

The decontamination mode of the method comprises steps S1 to S9. In the step S1, the controller 11 instructs the power supply 5 to supply and increase an electric current to the heating wire 13. In particular, the electric current is gradually increased by the power supply 5 up to a desired value of the electric current, and is then held constant. After increasing the electric current supplied to the heating wire 13, the power supply 5 changes to a constant current operation in the step S2, such that a supplied electric current is held constant at the desired value. While the constant current is supplied to the heating wire 13, the ion beam system 1 proceeds with the step S3. In step S3, the measurement tool 21 acquires at least two values of the voltage drop across the heating wire 13 and transmits them to the controller 11. The controller 11 is then able to determine a change over time of the voltage drop from the at least two values of the voltage drop measured by the measurement tool 21.

The controller 11 then stores the change over time of the voltage drop in the storage 67 in the step S4. Then, in the step S5, the controller 11 reads a predetermined value from the storage 67 and compares the change over time of the voltage drop with the predetermined value. The predetermined value may be, for example, an experimentally determined voltage drop across the heating wire 13 of an ion beam source 3 for which it is known that the metal reservoir 15 is almost or fully depleted. If the change over time of the voltage drop across the heating wire 13 is higher than or equal to the predetermined value, represented by "No" in the step S5, the ion beam source 3 is to be disposed in the step S7. For example, the controller 11 can display a maintenance message on the display 69 indicating that the ion beam source 3 has to be replaced with a new ion beam source in near future. Maintenance of the ion beam system 1 can then be requested by the user.

If the change over time of the voltage drop is smaller than the predetermined value, represented by "Yes" in the step S5, the ion beam source 3 can still be used in upcoming machining. In particular, in this case, the controller 11 adds the change over time in association with a usage time to history data. The usage time is an amount of time acquired during the step S2' of the beam generation mode of the method of operating the ion beam source 3 and, if desired, during the decontamination mode. The usage time may be acquired by measuring the time the ion beam source 3 is operated, or, for example, by measuring an amount of ions emitted from the ion beam source 3. The usage time can be determined as the sum of the measured times. It should be noted that the lifetime, as well as the usage time, may be given in units of time or, for example, in units of a cumulative operation current of the ion beam source 3.

The history data is a set of measured changes over time across the heating wire 13, each of the measured changes associated with the usage time when the measurement was performed.

The controller 11 then continues with step S8, in which the controller 11 uses the history data to determine a remaining lifetime of the ion beam source 3. The controller 11 then compares the extrapolated history data with the predetermined value read from the storage 67 in the step S9 and can then determine a remaining lifetime of the ion beam source 3 from the comparison result in step S10.

Figure 4:
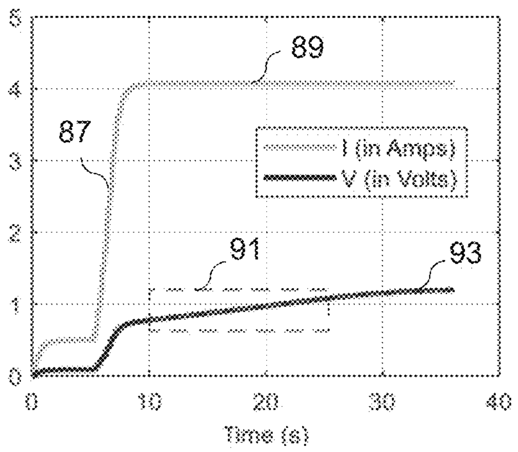
FIG. 4 is a diagram showing graphs of electric properties of the ion beam source included in the ion beam system of FIG. 1.

Below, the steps S1 to S3 are described in more detail with reference to FIG. 4. FIG. 4 is a diagram showing graphs of electric properties of the ion beam source 3 included in the ion beam system 1 of FIG. 1. Specifically, the horizontal axis shows the time during the decontamination mode in seconds, and the vertical axis shows the measured values of the electric current supplied to the heating wire 13 in Ampere, as well as the measured voltage drop across the heating wire 13 in Volts.

FIG. 4 shows, in accordance with step S1, in a timespan between 5 and 10 seconds a gradual increase 87 of the electric current supplied to the heating wire 13. At the end of this timespan, the electric current has reached a desired value. Afterwards, the power supply 5 is, in accordance with step S2, controlled such that the electric current supplied to the heating wire 13 is constant, which is represented by the constant section 89. During the time in which the supplied electric current is constant, the voltage drop over the heating wire 13 still increases gradually during the section 91, and converges to a constant value visible at the section 93.

When measuring the change over time of the voltage drop over the heating wire 13, two measurements can be made during the timespan of the section 91. For example, the measurements may be performed at the beginning of the relevant timespan at 10 seconds and at the end of the relevant timespan at 25 seconds. Thus, the change over time of the voltage drop across the wire can be calculated from the two measurements at 10 seconds and 25 seconds by calculating the slope of the linearly increasing section 91. Alternatively, the change over time of the voltage drop across the wire may be calculated for plural smaller intervals, such as 3 seconds intervals, between the $10^{th}$ second and the $25^{th}$ second, and the highest calculated slope of these smaller intervals is saved and included in the history data.

Figure 5:
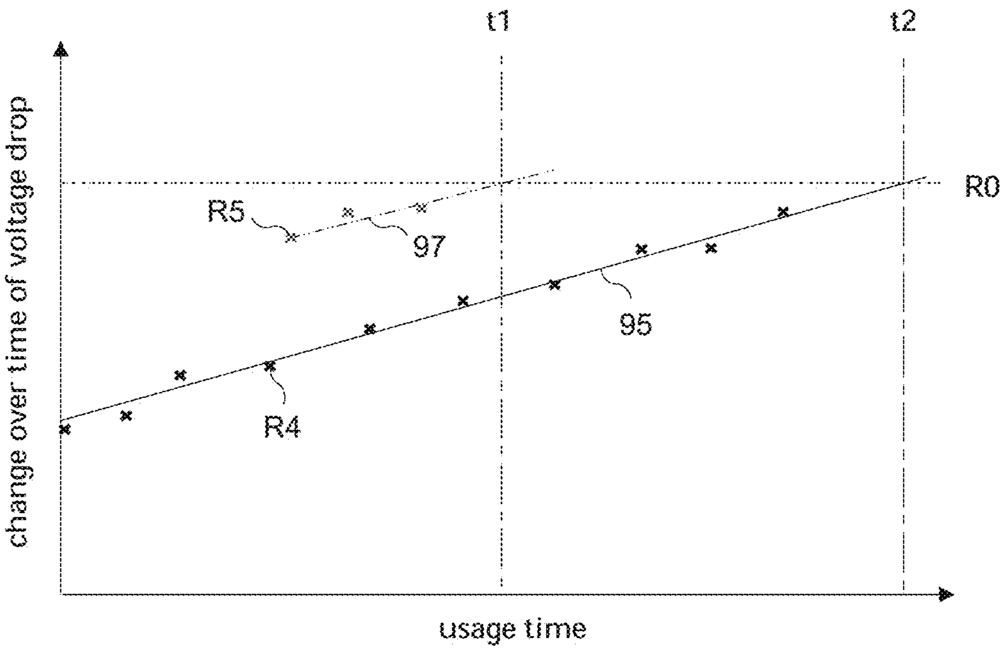
FIG. 5 is a diagram showing history data used in the method of operating the ion beam system of FIG. 1 according to an embodiment.

In the following, the steps S6 to S10 will be described in more detail with reference to FIG. 5. FIG. 5 is a diagram showing history data used in the method of operating the ion beam system 1 of FIG. 1 according to an embodiment.

The diagram of FIG. 5 shows the usage time on the horizontal axis, the usage time representing the total time the ion beam source 3 has been emitting ions. The change over time of the voltage drop across the heating wire 13 is shown on the vertical axis. Herein, values on the horizontal axis are named with the letter t, and values on the vertical axis are named with the letter R. FIG. 5 shows, indicated by the dashed and horizontal line, the reference value R0, which is, for example, measured from an ion beam source 3 from which it is known that the metal reservoir 15 is almost or fully depleted. Thus, when a measured change over time is located on or above the line R0, the ion beam source 3 should be disposed.

FIG. 5 shows ten measurements of the change over time of the voltage drop, indicated in black. Each time the steps S1 to S5 are performed, another measurement point is added to the history data shown in FIG. 5, as long as the change over time of the voltage drop is located below the line R0. In step S8, the controller 11 first determines a functional behavior of the ten measurement points, which is, in this case, a linear function 95. This linear function 95 intersects with the reference value R0 at the time t2, which is the expected end of life of the ion beam source 3. Thus, by extrapolating the ten measurements, the end of life of the ion beam source 3 can be determined, from which the remaining lifetime can be determined, which is the time between the usage time of the last measurement and the end of life at time t2.

In addition, the ion beam source may be subject to several defects. For example, the metal reservoir 15 of the ion beam source 3 may be overheated due to various defects. This results in too much metal being evaporated from the metal reservoir 15 and a strongly reduced lifetime, since the commonly used methods are not able to adapt the heating of the heating wire 13 in such a case.

In FIG. 5, a measurement R5 indicates a measurement after a defect occurs in a measurement following the measurement R4. In such a case, the ion beam source 3 is overheated due to the defect, and following the standard procedure would result in the linear behavior 97 and thus a strongly reduced lifetime t1 of the ion beam source 3. However, according to an embodiment of the present disclosure, an overheating of an ion beam source can be detected. In particular, when calculating a deviation of a measurement from the actual behavior 95, the measurement R5 results in an unreasonably high deviation.

This means that the controller 11 is able to detect the occurrence of defects due to unreasonably high deviations in measurements with respect to the linear function 95. However, FIG. 5 is just an example to emphasize an understanding of the processes during and after occurrence of a defect in the ion beam source 3. Ideally, the high deviation is recognized by the controller 11 much before measurement R5 is performed. In particular, the controller 11 is then able to recognize that a defect has occurred after the measurement R4 and adapt the supplying of power to the heating wire 13, such that future measurements will still follow the linear behavior 95 instead of jumping to the measurement R5 shown in FIG. 5. This may be realized by monitoring a slope between each pair of adjacent measurements, such that a tendency after the defect can be determined and compensated by adjusting the heating of the heating wire 13. Alternatively, any other technique may be used to determine the current slope of the measurement data, such as computing a current derivative of the measurement data.

In this way, when monitoring the slope of the measurement data, the controller 11 is able to detect an overheating of the ion beam source 3 and adapt the heating of the heating wire 13 during the beam generation mode and the decontamination mode, such that the ion beam source 3 is continued to be heated according to the linear function 95. In other words, the controller 11 may adapt the heating of the ion beam source 3 as if an offset would have been subtracted from the linear function 97 in FIG. 5 to correspond to the linear function 95. Therefore, the method according to the present disclosure is able to account for defects that result in an overheating of the ion beam source 3, which leads to more reliable indications of the lifetime of the ion beam source 3.

In addition, if the expected lifetime t2 is much shorter than the predetermined lifetime given by the manufacturer of the ion beam source 3 even in the absence of any defect, the controller 11 may adapt the heating of the heating wire 13 during the beam generation mode and the decontamination mode, such that the expected end of life t2 is substantially equal to the predetermined lifetime given by the manufacturer. This means that the controller 11 is also able to prevent continuous overheating during operation of the ion beam source 3.

It has to be noted that in this case, when adapting the heating current supplied to the heating wire 13, all of the history data previously collected has to be discarded, or at least disregarded for further analyzation. This is because the history data should only include data representing a specific heating current. If, for example, the heating current is changed during the time series along the linear function 95 shown in FIG. 5 such that the expected lifetime is longer than the time t2, the function 95 would have a sharp bend representing the time at which the heating current to the heating wire 13 is changed, with different slopes to either side of the sharp bend, similar to what is shown between the measurements R4 and R5 in FIG. 5. To take this into account, the data points to one side of the bend are used for determining the slope to the one side of the sharp bend, and the data points to the other side of the sharp bend are used for determining the slope of the other side of the sharp bend. Thus, the previous measurements are disregarded when analyzing the slope of the time series when the heating current provided to the heating wire 13 is adapted.

What is claimed is:

1. A method of operating an ion beam source comprising a heating wire, a metal reservoir mechanically connected to the heating wire and a tip mechanically connected to the metal reservoir, the method comprising:

operating the ion beam source in a beam generation mode, which comprises generating an ion beam from ions emitted from the tip; and operating the ion beam source in a decontamination mode, which comprises:

supplying power to the heating wire to raise the temperature of the heating wire to a decontamination temperature;

measuring a change over time of a physical property indicating a temperature of the heating wire while the power is supplied to the heating wire; and displaying an indication based on the measured change over time of the physical property, wherein the indication represents at least one member selected from the group consisting of a warning that the lifetime of the ion beam source expires soon and a message indicating that service is desired.

2. The method of claim 1, wherein the indication further represents an expected lifetime of the ion beam source.

3. The method of claim 1, further comprising deciding, based on the displayed indication, to continue using the ion beam source or to stop using the ion beam source.

4. The method of claim 1, further comprising deciding to stop using the ion beam, and disposing the ion beam source.

5. The method of claim 1, wherein supplying the power to the heating wire comprises supplying an electric current to the heating wire.

6. The method of claim 5, wherein supplying the power to the heating wire comprises controlling the current supplied to the heating wire so that the current is constant.

7. The method of claim 1, wherein the physical property comprises a voltage across the heating wire.

8. The method of claim 1, wherein, before deciding to stop using the ion beam source, the ion beam source is operated in the decontamination mode at least 10 times.

9. The method of claim 1, wherein operating the ion beam source in the beam generation mode comprises recording a usage value of the ion beam source representing at least one member selected from the group consisting of an amount of time the ion beam source has been operated in the beam generation mode and an amount of ions have been emitted from the tip of the ion beam source.

10. The method of claim 1, wherein measuring the change over time of the physical property comprises:

measuring a first value of the physical property at a first time that is at least 10 seconds after starting to supply the power to the heating wire and less than 25 seconds after starting to supply power to the heating wire;

measuring a second value of the physical property at a second time that is more than 10 seconds after starting to supply power to the heating wire and at most 25 seconds after starting to supply power to the heating wire, wherein the second time is different from the first time; and determining a first change over time between the first value and the second value based on the first time and the second time.

11. The method of claim 10, wherein measuring the change over time of the physical property further comprises:

measuring a third value of the physical property at a third time that is later than the second time and less than 25 seconds after starting to supply power to the heating wire, wherein the third time is different from the first and second times;

determining a second change over time between the second value and the third value based on the second time and the third time; and selecting a highest change over time from the first change over time and the second change over time.

12. The method of claim 1, wherein the indication represents at least one member selected from the group consisting of an expected lifetime of the ion beam source, a warning that the lifetime of the ion beam source expires soon, and a message indicating that service is desired.

13. One or more machine-readable hardware storage devices comprising instructions that are executable by one or more processing devices to perform operations comprising the method of claim 1.

14. A system comprising:

one or more processing devices; and one or more machine-readable hardware storage devices comprising instructions that are executable by the one or more processing devices to perform operations comprising the method of claim 1.

15. The system of claim 1, comprising an ion beam system which comprises:

an ion beam source, comprising:

a heating wire;

a metal reservoir mechanically connected to the heating wire; and a tip mechanically connected to the metal reservoir;

a power supply configured to supply power to the heating wire; and a controller configured to control the power supply.

16. A method of operating an ion beam source comprising a heating wire, a metal reservoir mechanically connected to the heating wire and a tip mechanically connected to the metal reservoir, the method comprising:

operating the ion beam source in a beam generation mode, which comprises generating an ion beam from ions emitted from the tip; and operating the ion beam source in a decontamination mode, which comprises:

supplying power to the heating wire to raise the temperature of the heating wire to a decontamination temperature;

measuring a change over time of a physical property indicating a temperature of the heating wire while the power is supplied to the heating wire;

displaying an indication based on the measured change over time of the physical property, and/or storing a change value based on the measured change over time of the physical property; and deciding, based on the displayed indication and/or the stored change value, to continue using the ion beam source or to stop using the ion beam source.

17. The method of claim 16, wherein the change value represents at least one member selected from the group consisting of an expected lifetime of the ion beam source, an amount of metal contained in the metal reservoir, a defect of the ion beam source, and an erroneous supplying of power when operating the ion beam source in the decontamination mode.

18. The method of claim 16, comprising storing history data comprising plural change values, wherein each change value is associated with the usage value of the ion beam source at the time when the change value is determined.

19. The method of claim 18, further comprising determining an expected remaining lifetime of the ion beam source based on the history data.

20. The method of claim 18, further comprising determining a change in a configuration of the ion beam source based on the history data.

21. The method of claim 16, wherein:

the indication represents at least one member selected from the group consisting of an expected lifetime of the ion beam source, a warning that the lifetime of the ion beam source expires soon, and a message indicating that service is desired; and the change value represents at least one member selected from the group consisting of an expected lifetime of the ion beam source, an amount of metal contained in the metal reservoir, a defect of the ion beam source, and an erroneous supplying of power when operating the ion beam source in the decontamination mode.

* * * * *